United States Patent [19]

Nagatsuka et al.

[11] Patent Number: 5,427,644
[45] Date of Patent: Jun. 27, 1995

[54] METHOD OF MANUFACTURING SEMICONDUCTOR WAFER AND SYSTEM THEREFOR

[75] Inventors: Shinji Nagatsuka; Takeshi Kagamida, both of Mitaka, Japan

[73] Assignee: Tokyo Seimitsu Co., Ltd., Tokyo, Japan

[21] Appl. No.: 167,025

[22] Filed: Dec. 16, 1993

[30] Foreign Application Priority Data

| Jan. 11, 1993 | [JP] | Japan | 5-002865 |
| Jan. 11, 1993 | [JP] | Japan | 5-002866 |
| Jan. 11, 1993 | [JP] | Japan | 5-002867 |
| Jan. 11, 1993 | [JP] | Japan | 5-002868 |

[51] Int. Cl.$^6$ ............................................. B32B 35/00
[52] U.S. Cl. ...................... 156/344; 156/584; 125/13.02; 437/8; 437/225; 437/249; 437/947
[58] Field of Search ................ 156/344, 584, 645; 125/13.02; 437/8, 225, 249, 947

[56] References Cited

U.S. PATENT DOCUMENTS

| 4,390,392 | 6/1983 | Robinson et al. | 156/645 X |
| 4,420,909 | 12/1983 | Steere, Jr. | 125/13.02 X |
| 4,599,558 | 7/1986 | Castellano, Jr. | 437/8 X |
| 5,227,339 | 7/1993 | Kishii | 437/249 X |
| 5,329,733 | 7/1994 | Steere, Jr. | 125/13.02 X |

*Primary Examiner*—Mark A. Osele
*Attorney, Agent, or Firm*—Oliff & Berridge

[57] ABSTRACT

An ingot is conveyed to a slicing machine by an ingot loader. Then, the ingot is cut into a wafer by the slicing machine. And, the cut wafer is conveyed to a peel-off portion and soaked in a warm water tank for a predetermined time so that the adhesive of the slice base can be heat softened, and then the slice base is hammered by a hammer rod so as to be peeled off from the wafer. Further, the wafer, from which the slice base has been peeled off, is conveyed to a wash-dry device, and washed and dried. The washed and dried wafer is conveyed to a surface inspecting device by a conveying device and judged a pass or fail to the wafer standard in the surface inspecting device. And, the passed wafer is conveyed to a chamfering device and the edge of the wafer is chamfered by the chamfering device. Then, the chamfered wafer is washed and dried by a wash-dry device, thereafter, conveyed to the storing part by the conveying device and stored.

13 Claims, 13 Drawing Sheets

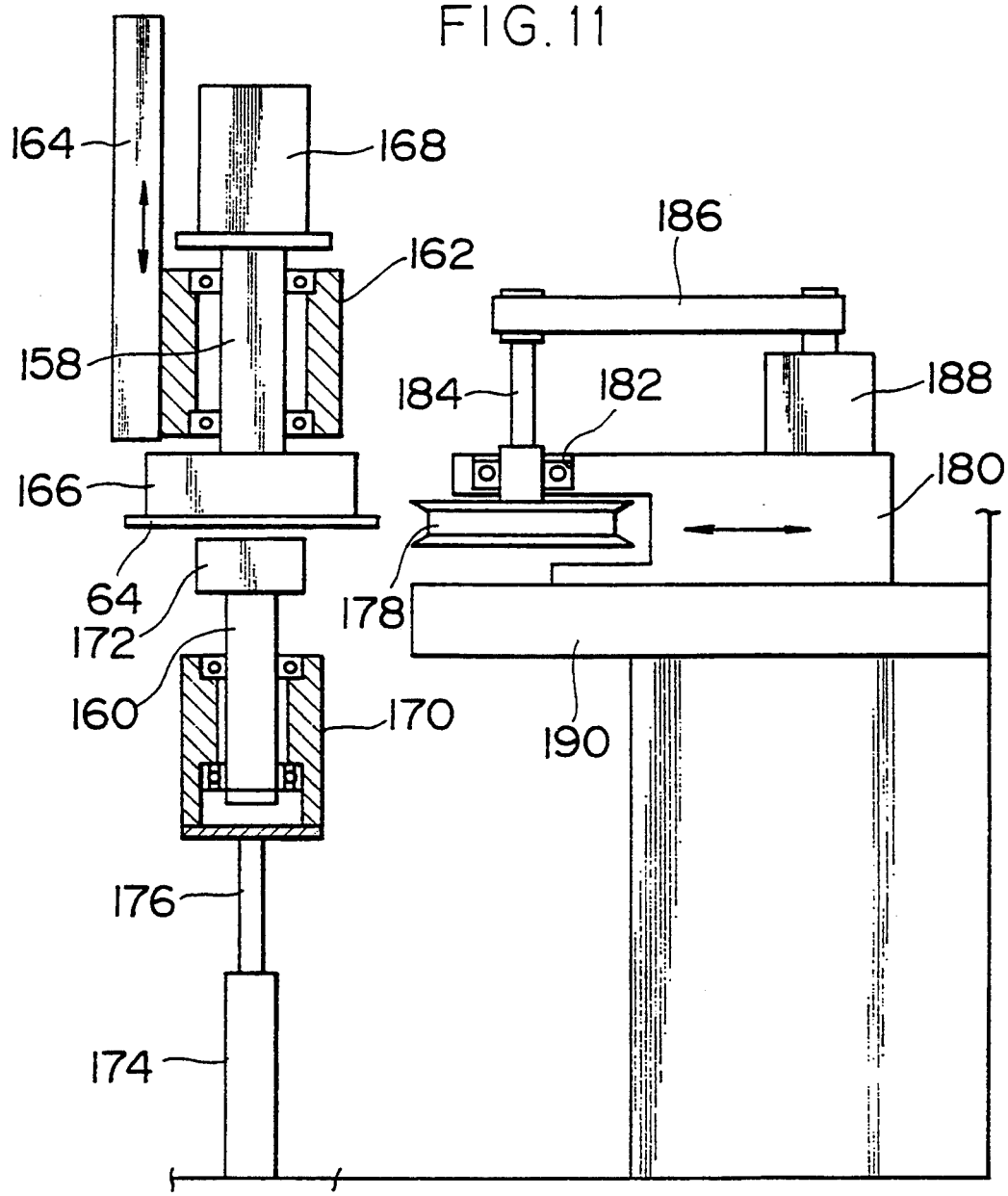

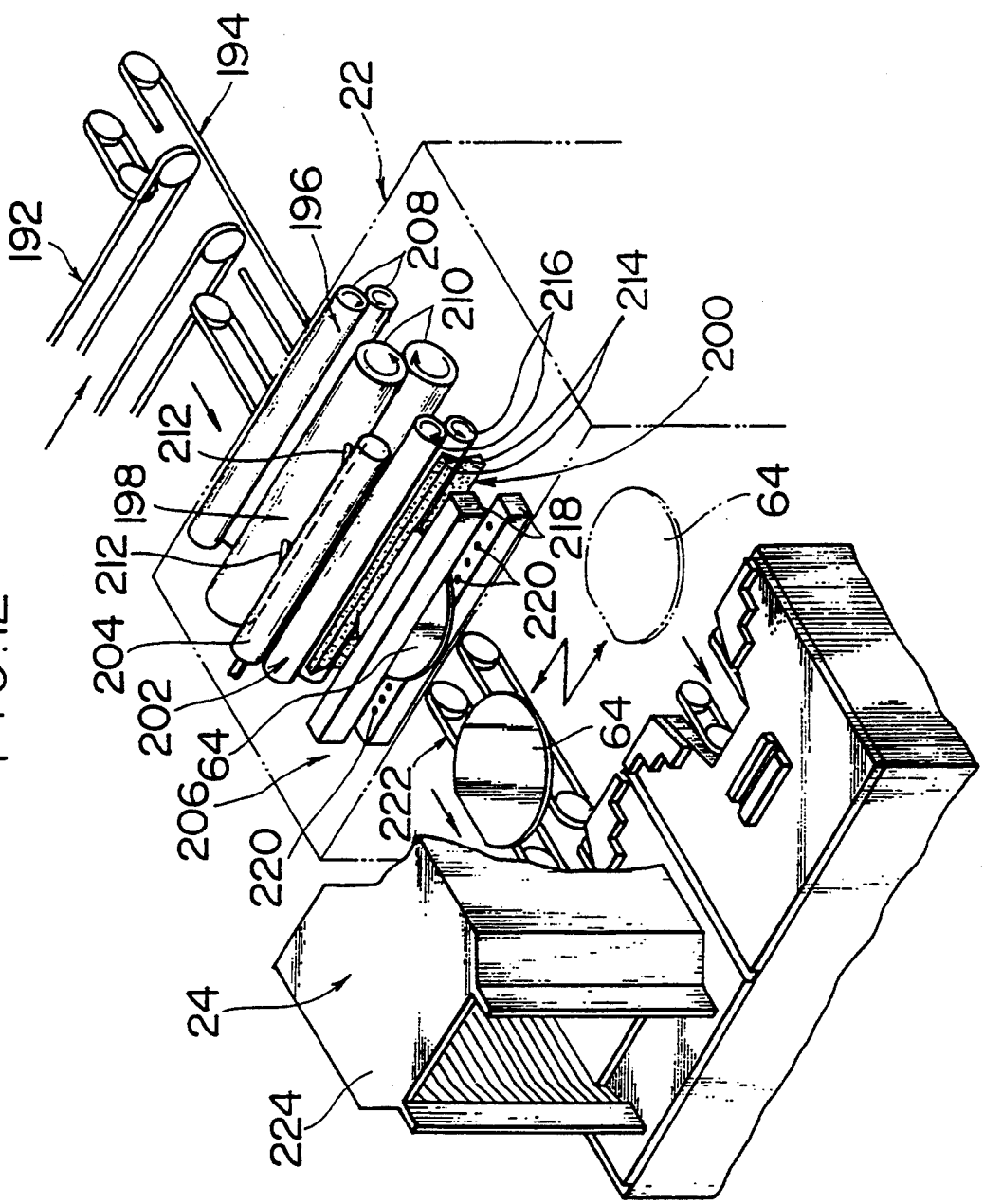

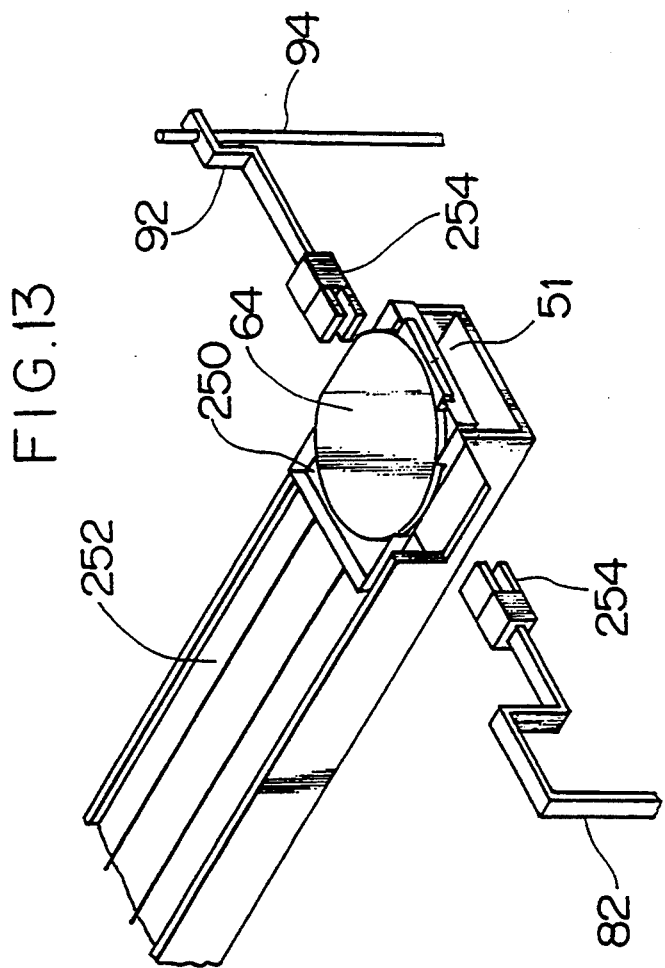

METHOD OF MANUFACTURING SEMICONDUCTOR WAFER AND SYSTEM THEREFOR

BACKGROUND OF THE INVENTION

1. Field of the Invention

This invention relates to a method of manufacturing semiconductor wafers and a system therefor, more particularly, to a method of manufacturing semiconductor wafers and a system therefor wherein a thin piece-shaped wafer is manufactured from a silicon ingot which is a semiconductor wafer material.

2. Description of the Related Art In the manufacturing process of the semiconductor wafer, a silicon ingot is carried to a slicing machine and fixed thereto, then, the slicing machine is operated so that the ingot is cut into the semiconductor wafer with a predetermined thickness.

Next, the wafer cut with the slicing machine is carried to the independent peel-off device for the slice base, and then, is immersed for a predetermined time in the chemical vessel provided in the peel-off device, so that the adhesive of the slice base is dissolved and then the slice base is peeled off from the wafer.

Then, the wafers of which the slice base are peeled off are carried to the wash-dry device and ultrasonic-cleaned one by one or by the batch processing so as to remove chips and the like on the surface thereof, thereafter, the wafer is conveyed to the dry part to be spin-dried.

And, the dried wafer is carried to the chamfering device and the edge of the wafer is chamfered thereby, thereafter, it is carried to the wash-dry device again and washed and dried, then stored in the cassette.

The wafer is manufactured from the ingot by this process.

However, in the conventional system for manufacturing semiconductor wafers, each process is independent, so that the wafer must be carried to the next process whenever one process is finished, therefore, there is a disadvantage in that the manufacturing is performed inefficiently because of the time which is lost between the processes, and the troubles and the like.

Moreover, the ingot which is the semiconductor wafer material is lifted manually and fixed to the ingot holding part, therefore, there are disadvantages in that the work to lift the heavy ingot and fix it to the ingot holding part requires a lot of help and takes a lot of time, and further, the installation work is dangerous.

Further, in the conventional method of peeling off the slice base of the semiconductor wafer, since chemicals are used, there is a disadvantage in that it is necessary to process the waste fluid when these chemicals are disposed.

And, in the method of peeling off the slice base, the semiconductor wafer must be immersed in the chemicals until the adhesive dissolves, therefore, there is a disadvantage in that it takes a lot of time.

In addition, in the conventional method of washing and drying the semiconductor wafer, the wafer must be conveyed to the drying part and dried after washing at the ultrasonic washing part, therefore, there are disadvantages in that the system is large-sized and it takes a lot of time to wash and dry the semiconductor wafer.

SUMMARY OF THE INVENTION

This invention has been developed to eliminate the above-described disadvantages and aims to provide a method of manufacturing a semiconductor wafer and a system therefore, wherein the semiconductor wafer can be manufactured automatically, an ingot can be easily fixed to a slicing machine, a slice base can be peeled off in a short time without chemicals and the semiconductor wafer, after being cut by the slicing machine, can be washed and dried efficiently in a shorter time.

To achieve the above-described aim, this invention is characterized in that a columnar ingot is conveyed by an ingot conveying means and mounted on a slicing machine; said ingot mounted on said slicing machine is cut into thin piece-shaped wafers by said slicing machine; said wafer cut by said slicing machine is conveyed by a first wafer conveying means to a peel-off means and a slice base of said wafer is peeled off said wafer by said peel-off means; the wafer whose slice base is peeled of by said peel-off means is conveyed to a first wash-dry means by a second wafer conveying means and said wafer is washed and dried by the first wash-dry means; said wafer which has been washed and dried by the first wash-dry means is conveyed to a chamfering means by a third wafer conveying means and edges of said wafer are chamfered by said chamfering means; said wafer which has been chamfered by said chamfering means is conveyed to a second wash-dry means by a fourth wafer conveying means and said wafer is washed and dried by the second dry-wash means; and said wafer which has been washed and dried by the second wash-dry means is conveyed to a storing portion by a fifth wafer conveying means and stored in the storing portion.

Moreover, to achieve the above-described aim, this invention is characterized by comprising an ingot conveying means for conveying a columnar ingot; a slicing machine mounted thereon with said ingot conveyed by said ingot conveying means, for cutting said ingot into thin piece-shaped wafers; a peel-off means connected to said slicing machine through a first conveying means, for peeling off a slice base of said wafer which has been cut by said slicing machine from said wafer; a first wash-dry means connected to said peel-off means through a second wafer conveying means, for washing and drying said wafer, from which the slice base has been peeled off by said peel-off means; a chamfering means connected to the first wash-dry means through a third wafer conveying means, for chamfering edges of said wafer which have been washed and dried by the first wash-dry means; a second wash-dry means connected to the chamfering means through a fourth wafer conveying means, for washing and drying said wafer which has been chamfered by the chamfering means; and a storing portion connected to the second wash-dry means through a fifth wafer conveying means, for storing the wafers which have been washed and dried by the second wash-dry means.

According to this invention, first, the ingot is conveyed to the slicing machine by the ingot conveying means and mounted thereon. Next, the ingot is cut into thin piece-shaped wafers with the slicing machine. Then, the wafer, which is cut with the slicing machine, is conveyed to the peel-off means by the first wafer conveying means, and the slice base is peeled off from the wafer thereby.

And, the wafer, of which the slice base has been peeled off by the peel-off means, is conveyed to the first wash-dry means by the second wafer conveying means, and washed and dried thereby. Then, the wafer, which has been washed and dried by the first wash-dry means, is conveyed to the chamfering means by the third wafer conveying means, and the edge of the wafer is chamfered thereby.

Then, the wafer, of which the edge has been chamfered by the chamfering means, is conveyed to the second wash-dry means by the fourth wafer conveying means, and washed and dried thereby. And, the wafer, which has been washed and dried by the second wash-dry means, is conveyed to the storing portion by the fifth wafer conveying means and stored therein.

Moreover, according to this invention, the wafer, which has been washed and dried by the first wash-dry means, is conveyed to the surface inspecting means by the sixth wafer conveying means, and a pass or fail of the standard for the wafer is determined thereof.

And, the wafer, which has been determined to pass by the surface inspecting means, is conveyed to the chamfering means by the seventh wafer conveying means.

Therefore, since the wafer, which has been determined to fail by the surface inspecting means, is not chamfered, the wafer meeting the standard can be efficiently manufactured.

On the other hand, according to the method of conveying the ingot in this invention, first, a plurality of ingots are moved to the vicinity of the post by the ingot supplying device. Next, the chuck member is moved to the vicinity of the ingot supplying device and lowered, and the upper engageable portion of the ingot on the ingot supplying device is engaged in the engageable portion of the chuck member. Then, the ingot is lifted with the chuck member, and conveyed to the ingot support portion of the slicing machine in the suspended state. And, the chuck member is lowered and the ingot is delivered to the ingot support portion.

Therefore, the ingot can be easily fixed to the ingot support portion of the slicing machine without requiring help.

Moreover, according to the method of peeling off the slice base in this invention, the wafer is immersed in warm water having such a temperature that heat softening adhesive of the slice base is heat softened for a predetermined time, thereafter, the wafer is taken out of the warm water and held by the means for holding the wafer, and the slice base is hammered by the hammering means to be peeled off from the wafer.

Therefore, the slice base can be peeled off without chemicals in a short time.

Further, according to the peel-off means of the slice base in this invention, heat softening adhesive of the slice base attached to the semiconductor wafer is heated locally to be heat softened, and the semiconductor wafer, of which heat softening adhesive has been heat softened, is held by the means for holding the wafer, thereafter, the slice base is pulled and peeled off from the semiconductor wafer by the peel-off means.

Therefore, the slice base can be peeled off without chemicals in a short time.

In addition, according to the method of washing and drying the wafer in this invention, the wafer, which is cut by the slicing machine, is conveyed and supplied to the washing portion by the conveying portion, then, first, the wafer is washed with the rotary brush while spraying water in the washing portion, so that chips and the like are removed from the surface thereof, next, water drips adhering to the wafer are removed by the wiper portion, and then air is blown against the wafer to dry the wafer.

Thus, the semiconductor wafer, which has just been cut by the slicing machine, can be efficiently washed and dried in a short time.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein:

FIG. 11 is an essential explanatory view showing an embodiment of the wafer chamfering device applied to the system for manufacturing the semiconductor wafer according to this invention;

FIG. 12 is a perspective view showing the embodiment of the wafer wash-dry device applied to the system for manufacturing the semiconductor wafer according to this invention; and FIG. 13 is an essentially a prespective view showing another embodiment of the semiconductor wafer conveying device applied to the system for manufacturing the semiconductor wafer according to this invention.

DESCRIPTION OF THE PREFERRED EMBODIMENT

Detailed description will hereafter be given of the preferred embodiment of the method of manufacturing the semiconductor wafer and the system therefor according to the present invention with reference to the accompanying drawings.

Figure 1:
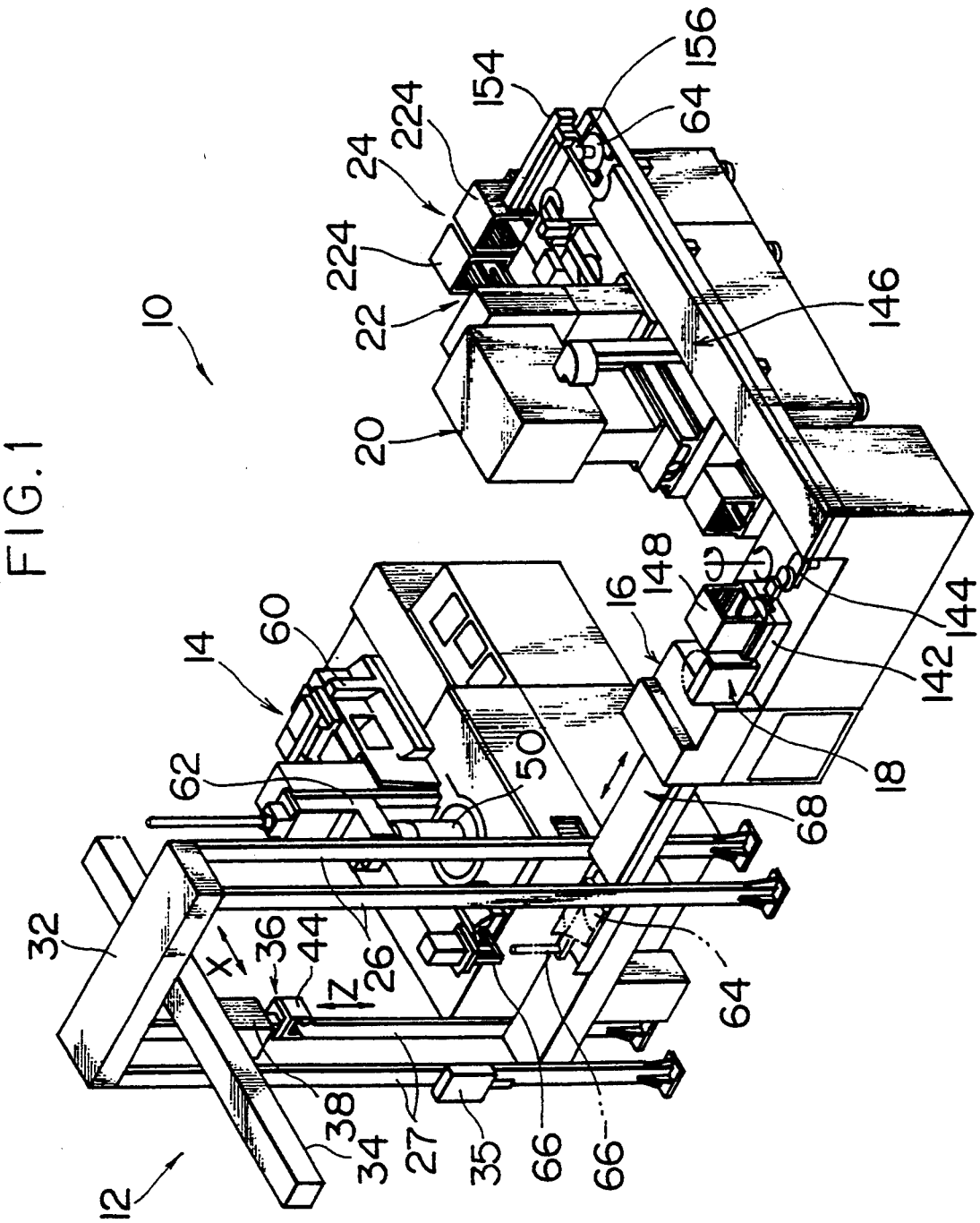
FIG. 1 is a perspective view showing the whole structure of a system for manufacturing a semiconductor wafer according to this invention.

FIG. 1 is a perspective view showing the whole structure of a system for manufacturing the semiconductor wafer according to this invention. The system 10 for manufacturing the semiconductor wafer consists of an ingot loader 12, a slicing machine 14, a peel-off and wash-dry device 16, a surface inspecting device 18, a chamfering device 20, wash-dry device 22, and a wafer storing portion 24.

Figure 2:
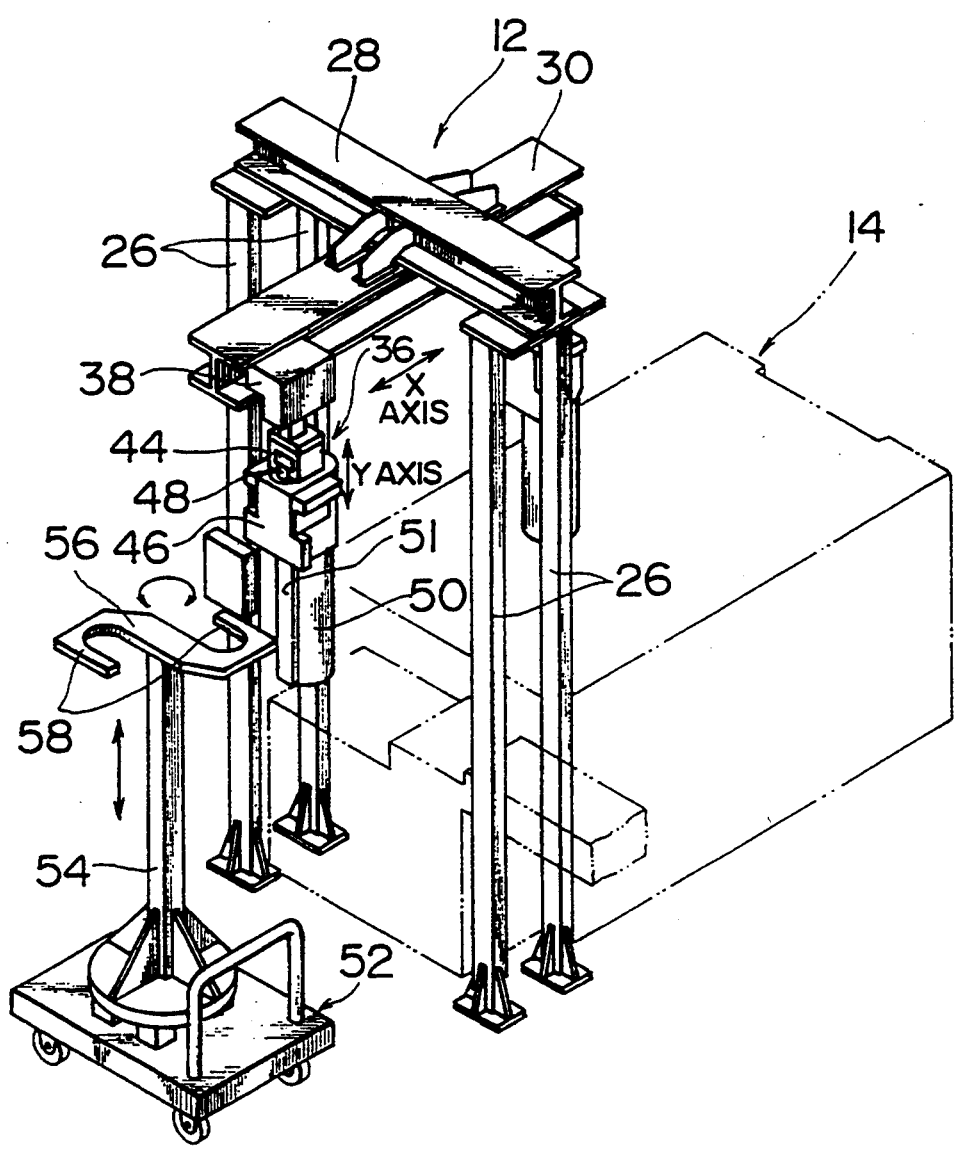
FIG. 2 is a perspective view showing an embodiment of an ingot loader applied to the system for manufacturing the semiconductor wafer according to this invention.

The ingot loader 12 is placed in such a way that the front portion of the slicing machine 14 is lain between a pair of posts 26, 27, as shown in FIGS. 1 and 2. A support beam 28 is spanned and fixed in the upper ends of the pair of posts 26, 27, and a guide rail 30 is fixed to this support beam 28 in the direction right-angled to the support beam 28. The guide rail 30 is provided from the upper side of an ingot conveying truck 52 shown in FIG. 2, that is the position where an ingot 50 is delivered, to the upper side of a work index mechanism 62 of the slicing machine 14. The ingot conveying truck 52 and the slicing machine 14 are described later. Incidentally, the support beam 28 and the guide rail 30 are enveloped with respective covers 32 as shown in FIG. 1.

Figure 3:
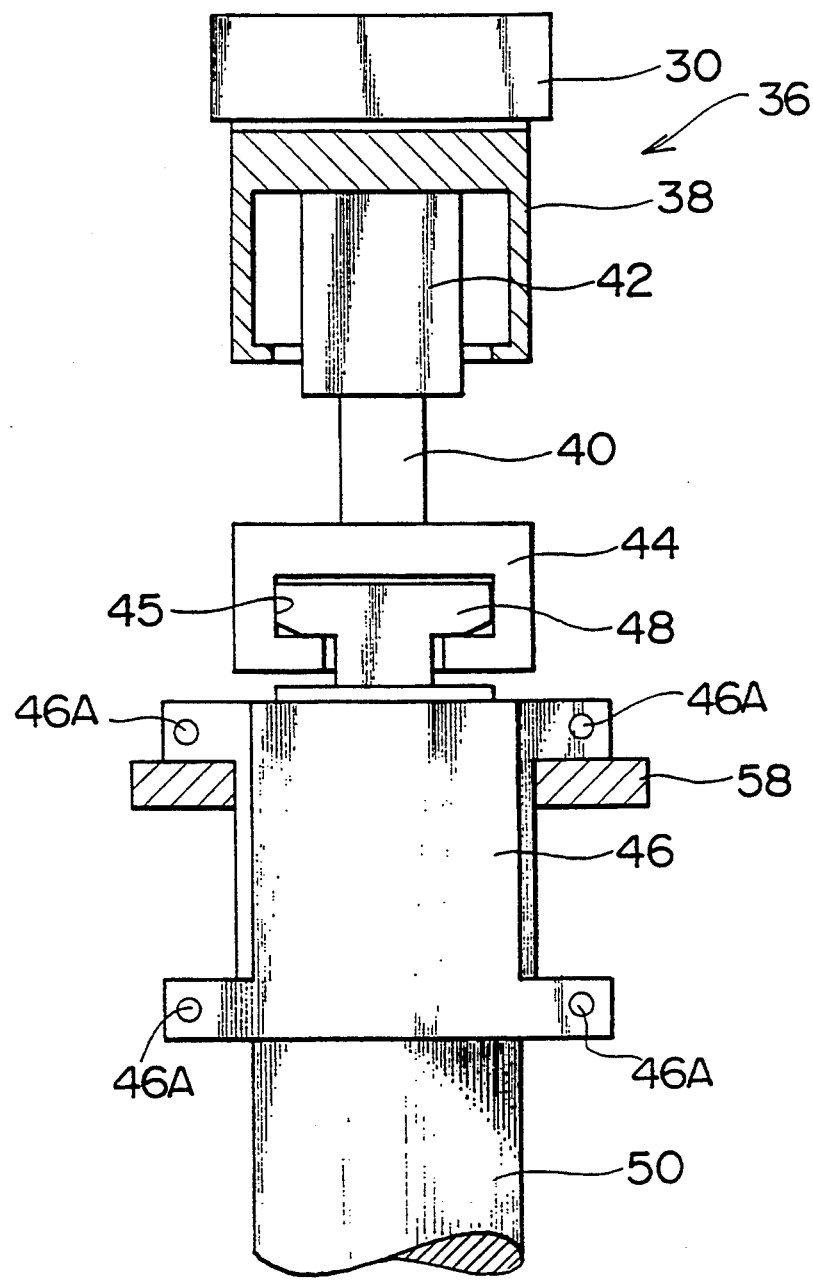
FIG. 3 is a front view showing the state that an ingot is fixed to the ingot loader applied to the system for manufacturing the semiconductor according to this invention.

A loader part 38 is provided with the guide rail 30 such as is capable of moving along the guide rail 30 in the direction of the arrow (the X-direction) in FIG. 2. The loader part 36 is driven under control by an operation part 35 attached to the post 27. Moreover, the loader part 36 is composed of a loader main body 38 movably attached to the guide rail 30 and a hydraulic cylinder 42 fixed to the loader main body 38 in the state that a cylinder rod 40 is faced downward, as shown in FIG. 3. An ingot support member 44 is fixed to the bottom of the cylinder rod 40, and an engageable part 48 fixed to the upper end of a work block 46 is engaged with an engageable slot 45 of the ingot support member 44 whereby the ingot 50 is held.

The ingot 50 is conveyed from the ingot keeping place to the vicinity of the post 26 of the ingot loader 12 by the ingot conveying truck 52 shown in FIG. 2. A movable rod 54 which can go up or down is fixed to the ingot conveying truck 52 in the perpendicular direction, and an almost S-shaped hook part 56 is attached to the upper end of the movable rod 54 which can go up and down. The work block 46 is fixed to a pair of latching slots 58 and 58 formed in the hook part 56, whereby the ingot 50 is held by the conveying truck 52, and further, the movable rod 54 which can go up or down is raised, whereby the ingot 50 is raised to the position of the loader part 36 and held thereby.

The slicing machine 14 is an already-known slicing machine. In the slicing machine 14, the work index mechanism 62 is mounted on the work conveying mechanism 60 moved in the X-direction, as shown in FIG. 1. The ingot 50 which has been conveyed by the ingot loader 12 is fixed to the work index mechanism 62 and is indexed in the cutting direction (the Z-direction). An inner peripheral edge, not shown, is placed under the work conveying mechanism 60, and the ingot 50 fixed to the ingot index mechanism 62 is cut into wafers by the inner peripheral edge. The inner peripheral edge is formed with a doughnut-shaped blade with diamond-grains electro-deposited on the inner periphery. Moreover, the inner peripheral edge is suspended by the chuck body provided in the slicing machine 14 at the external periphery of the blade, and rotated at high speed with a rotation mechanism not shown.

Figure 4:
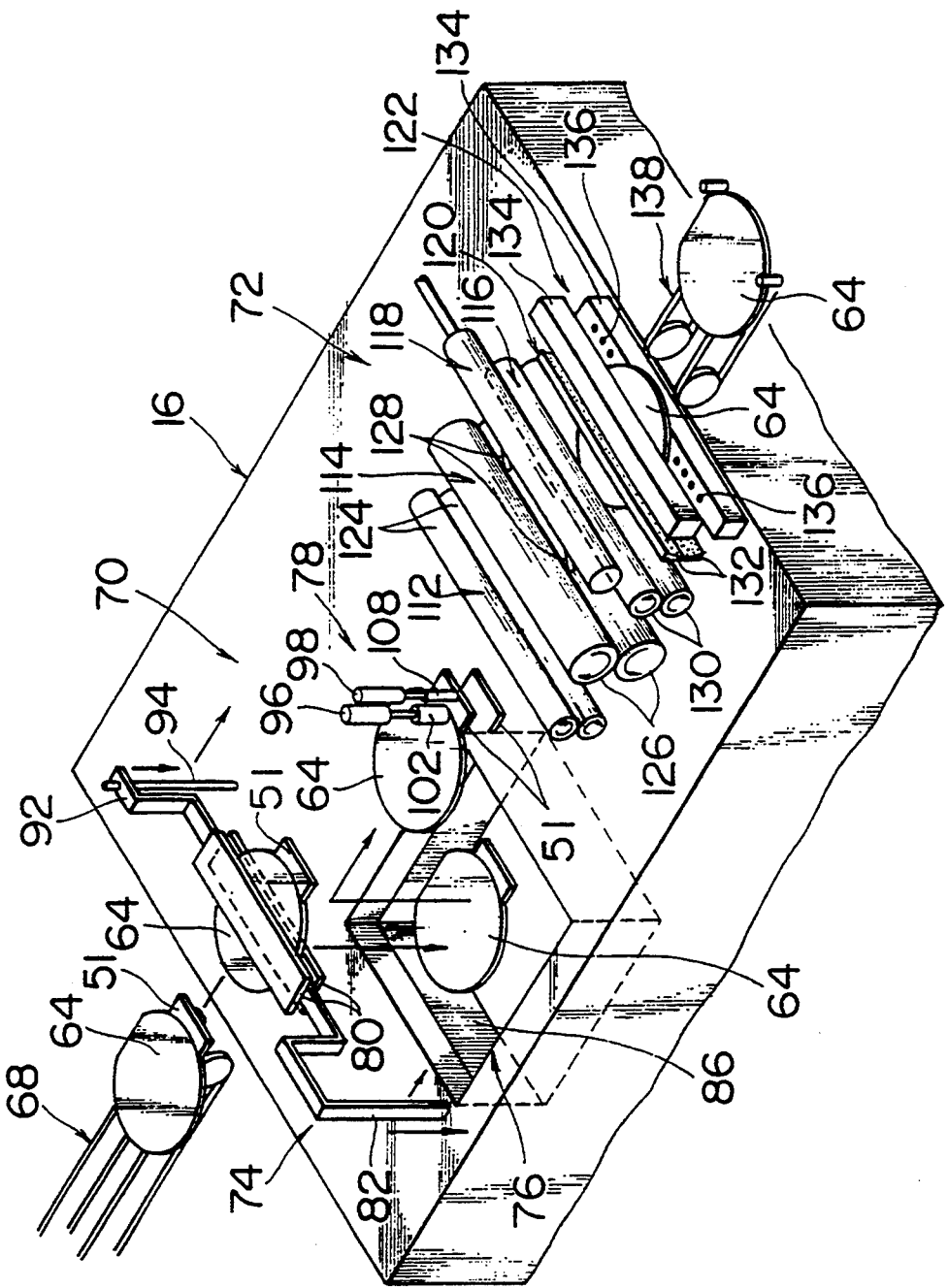
FIG. 4 is a perspective view showing an embodiment of the peel-off device of the slice base and the wafer wash-dry device applied to the system for manufacturing the semiconductor wafer according to this invention.
Figure 5:
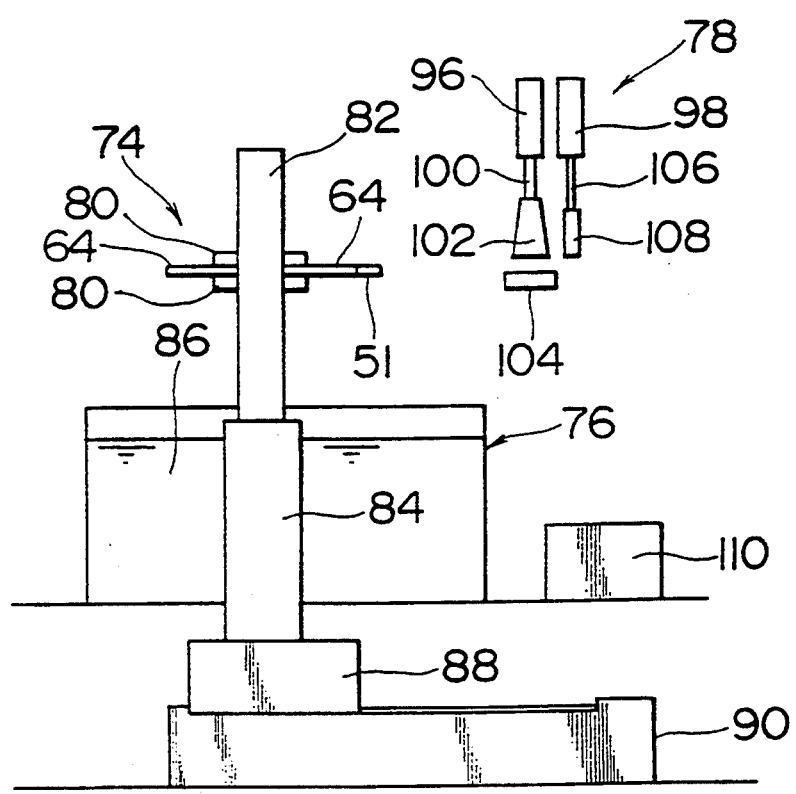
FIG. 5 is an explanatory view of the operation in the peel-off device of the slice base applied to the system for manufacturing the semiconductor wafer according to this invention.

A wafer 64 cut with the slicing machine 14 is adsorbed by the already-known wafer suction device, not shown, and conveyed with a conveying device 68 composed of a wafer conveying device 66 and a rodless cylinder. The wafer 64 moved by the conveying device 68 is conveyed to the peel-off and wash-dry device 16. The peel-off and wash-dry device 16 consists of a peel-off device 70 for the slice base 51 and a wash-dry device 72 for the wafer 64, as shown in FIG. 4. The peel-off device 70 has a moving mechanism 74 for the wafer 64, a warm water tank 76 and hammer part 78. The moving mechanism 74 has a pair of plates 80 and 80 for holding the wafer 64 conveyed from the conveying device 68. The point end portion of the arm 82, which is bent in a concave shape, is fixed to the left end portion of the plates 80 and 80 in FIG. 4. The arm 82 which is mounted on the hydraulic cylinder 84 has the ability to go up and down as shown in FIG. 5. When the arm is contracted by operating the hydraulic cylinder 84, the wafer 64 is soaked in the warm water 86 stored in the warm water tank 76 with the plates 80 and 80. Incidentally, at the temperature of the warm water 86, the heat softening adhesive which bonds the slice base 51 to the wafer 64 must be able to be heat softened, for instance, 90° C. is assumed in this embodiment. (Refer to FIG. 6).

Further, the lower part of the hydraulic cylinder 84 is fixed on the base 88 which can be moved on the rail 90. The rail 90 is located in parallel with the warm water tank 76. When the base 88 is sliced to the position indicated in FIG. 7 and the arm 82 is expanded, the wafer 64 is conveyed to the hammer part 78.

On the other hand, the point end portion of the arm 82, which is bent in a step shape, is fixed to the right end portion of the plates 80 and 80 in FIG. 4, and the base of the arm is attached to the bar 94 and is slidable in the axis-direction thereof. The bar 94 is located in parallel with the cylinder 84 shown in FIGS. 5–7 and can be moved in the moving direction of the base 88 with the slide movement thereof.

Moreover, as shown in FIG. 13, the wafer 64 may be mounted on the tray 250 so it can be conveyed to the peel-off and wash-dry device 16. The tray 250 can move along the guide rail 252 which faces the peel-off and wash-dry device 16. The wafer 64 mounted on the tray 250 is conveyed to the peel-off and wash-dry device 16, and then, is chucked by holding plates 254, 254 which are provided on both sides of the wafer 64, so that the wafer 64 is soaked in the warm water tank 76 show in FIG. 4 with the holding plates 254, 254 according to the movement thereof.

Figure 8:
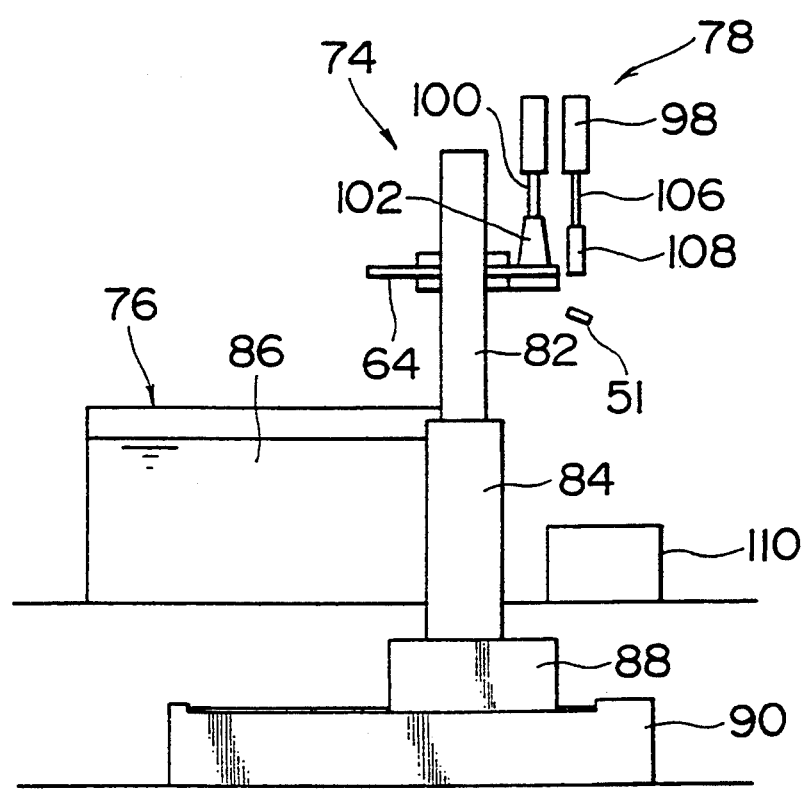
FIG. 8 is an explanatory view of the operation in the peel-off device of the slice base applied to the system for manufacturing the semiconductor wafer according to this invention.

The hammer part 78 has a holding cylinder 96 for the wafer 64 and a peel-off cylinder 98 for the slice base 51. In the holding cylinder 96, the cylinder rod 100 is expanded, whereby the wafer can be held by the holding rod 102 and the holding base 104 as shown in FIG. 8. Moreover, in the peel-off cylinder 98, the cylinder rod 106 is expanded, whereby the slice base 51 of the wafer 64 is hammered and can be peeled off therefrom. The peeled off slice base 51 is collected in the bucket 110 located under the hammer part 78.

The wash-dry device 72 is composed of the conveying roller 112, the wash-brush roller 114, the conveying roller 116, the washing water injection part 118, the scraper 120 and the dry part 122 as shown in FIG. 4.

The conveying roller 112 consists of a pair of rollers 124 and 124, and is rotated by the driving force from the driving part, not shown, in the direction of the arrow in the FIG. 4, whereby the wafer 64 which the slice base 51 has been peeled off in the peel-off part 70 is placed between the rollers 124 and 124, so that it can be conveyed to the wash-brush roller 114.

The wash-brush roller 114 consists of a pair of brush rollers 126 and 126, and is rotated by the driving force from the driving part, not shown, whereby the conveyed wafer 64 is placed between the rollers 126 and 126, so that chips and the like adhered to the wafer 64 can be brushed off by the brush. And, the chips and the like adhered to the brush can be peeled off and removed with the washing water injected from the nozzles of the washing water injection part 118.

The conveying roller 116 consists of a pair of rollers 130 and 130, and is rotated by the driving force from the driving part, not shown, in the direction of the arrow in the FIG. 4, whereby the washed wafer 64 is placed between the rollers 130 and 130, so that it can be conveyed to the scraper 120.

The scraper 120 consists of a pair of wiper members 132 and 132, and the wafer 64 passes between, whereby the drops adhered to the surface of the wafer 64 can be removed.

The dry part 122 consists of a pair of air blow-off parts 134 and 134, and the wafer passes between, whereby the wafer 64 can be dried by the air blown off from the blow-off holes 136, 136. The dried wafer 64 is conveyed to the surface inspecting device 18 shown in FIG. 1 by the conveying device 138.

Figure 9:
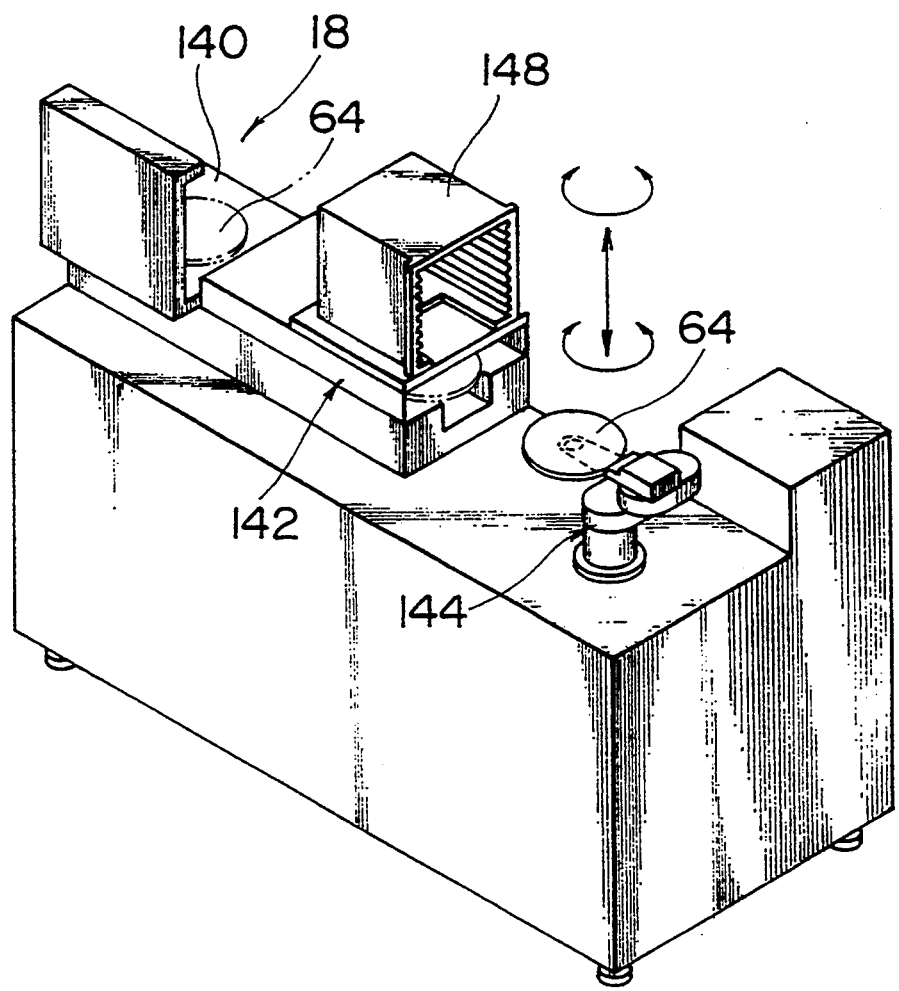
FIG. 9 is a perspective view showing an embodiment of the surface inspecting device applied to the system for manufacturing the semiconductor wafer according to this invention.

As for the wafer 64, the thickness, the flatness and the like are measured on the inspecting table 140, shown in FIG. 9 of the surface inspecting 18 and a pass or fail to the standard is judged based on the measurement value. The wafer 64 which passed the standard is conveyed to the already-known direction conversion device 144 by the conveying device 142, and then, is adsorbed by the direction conversion device 144 and conveyed to the conveying device 146 shown in FIGS. 1 and 10. Incidentally, the wafer 64 which fails the standard is stored in the cassette 148 shown in FIGS. 1 and 9.

Figure 10:
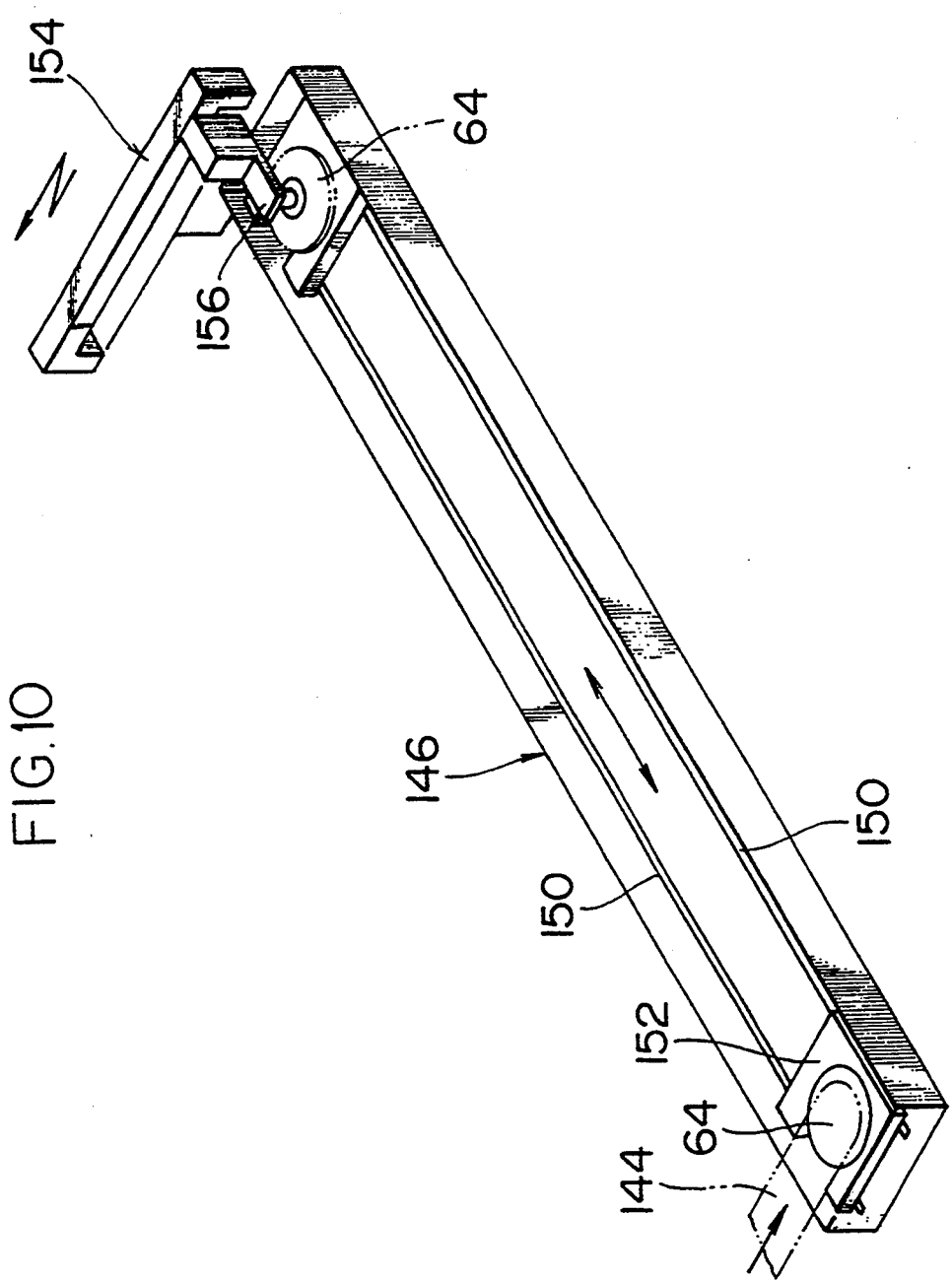
FIG. 10 is a perspective view showing an embodiment of the wafer conveying device applied to the system for manufacturing the semiconductor wafer according to this invention.

The conveying device 146 has the tray 152 which can move along a pair of rodless cylinders 150 and 150 as shown in FIG. 10, and when the tray 152 is positioned at the starting portion (the left end portion in FIG. 10), the wafer 64 conveyed by the direction conversion device 144 is put on the tray 152. When tray 152 is moved to the terminal portion of the rodless cylinders 150 and 150 (the right end portion in FIG. 10), the wafer 64 put on the tray 152 is adsorbed by the adsorption arm 156 of the conveying device 154 so as to be moved in the direction of the arrow in FIG. 10 and is conveyed to the chamfering device 20 shown in FIG. 1.

The chamfering device 20 has the upper vertical axis 158 which sucks the wafer 64 to clamp and the lower vertical axis 160 which unloads the wafer 64 after processing as shown in FIG. 11. The upper vertical axis 158 is supported rotatably by the bearing box 162, which is provided such that can slide along the guide rail 164 installed in the perpendicular direction. Moreover, the master 166 for clamping position of the wafer 64 by the suction is fixed to the bottom of the upper vertical axis 158 and the motor 168 is connected on the top.

The lower vertical axis 160 is supported rotatably by the bearing box 170. The adsorption part 172 which sucks the processed wafer is fixed on the top thereof. The cylinder rod 176 of the hydraulic cylinder 174 is fixed to the bottom of the bearing box 170. With this arrangement, when the cylinder rod 176 is expanded and contracted, the bearing box 162 moves up and down along the guide rail 164, so that the processed wafer 64 can be unloaded.

The grindstone 178 for chamfering the upper and lower surface edges of the wafer 64 is located in the vicinity of the adsorbed wafer 64. The grindstone 178 is fixed to the grindstone axis 184 installed on the moving table 180 through the bearing 182, and the rotation power of the motor 188 is transmitted to the grindstone axis 184 through the belt 186. The motor 188 is fixed on the moving table 180. On the other hand, the moving table 180 is mounted on the guide rail 190 such that can move in the horizontal direction along the guide rail 190. That is, the moving table 180 is controlled to move in the left-direction in FIG. 11, so that the grindstone 178 presses against the edge of the wafer 64 when chamfering the wafer 64, and to move in the right-direction so as to separate from the wafer 64 when the chamfering ends. The chamfered wafer 64 is conveyed to the wash-dry device 22 through the conveying device 192 and 194 shown in FIG. 12.

The wash-dry device 22 is composed of the conveying roller 196, the wash-brush roller 198, the scraper 200, the conveying roller 202, the washing water injection part 204 and the dry part 206.

The conveying roller 196 consists of a pair of rollers 208 and 208, and rotated in the direction of the arrow in FIG. 12 by the driving power from the driving part, not shown, whereby the wafer 64 is placed between the rollers 208 and 208 to convey to the wash-brush roller 198.

The wash-brush roller 198 consists of a pair of brush rollers 210 and 210. The wash-brush roller 198 is rotated by the driving power from the driving part, not shown, whereby the wafer 64 is got between the brush rollers 210 and 210 so that chips and the like adhered to the wafer can be removed with the brush. The chips and the like adhered to the brush can be peeled off and removed with the washing water jetted from the nozzle 212 and 212 of the washing water injection part 204.

The conveying roller 202 consists of a pair of rollers 216 and 216, and rotated in the direction of the arrow in the FIG. 12 by the driving power from the driving part, not shown, the washed wafer 64 is placed between the rollers 216 and 216 so that it can be fed to the wiper dry part 206.

The scraper 200 consists of a pair of wiper members 214 and 214, and the wafer 64 passes therebetween, whereby the water drops adhering to the surface of the wafer 64 can be removed.

The dry part 206 consists of a pair of air blow-off parts 218 and 218, and the wafer 64 passes therebetween, whereby the wafer 64 can be dried the air blown from the air blow-off holes 220, 220. The dried wafer 64 is conveyed to the wafer storing portion 24 by the conveying device 222 shown in FIGS. 1 and 12.

The cassette 224 is provided at the wafer storing portion 24 and the wafers 64 conveyed with the conveying device 222 are stored one by one.

Next, the explanation will be given of the action in the system for manufacturing the semiconductor wafer structured as the above-mentioned.

First, the ingot 50 is held in the hook part 56 of the conveying truck 52 shown in FIG. 2, and conveyed to the delivery position of the ingot conveying device 12. And, the ingot 50 is raised by the movable rod 54 of the conveying truck 52 and the cylinder rod 40 on the ingot conveying device 12 side is extended. Then, the conveying truck 52 is rotated and the engageable portion 48 of the work block 46 is engaged with the engageable slot 45 of the chuck member 44, and then, the ingot 50 is held in the ingot conveying device 12. And, the cylinder rod 40 is contracted and the ingot 50 is raised, whereby the ingot 50 is prevented from colliding with the slicing machine 14 while conveying.

Next, the loader part 36 of the ingot conveying device 12 is driven under control by the operation part 35 and moved in the direction of the slicing machine 14, and the loader part 36 is stopped when the ingot 50 is located under the work index mechanism 62 of the slicing machine 14. And, the cylinder rod 40 of the ingot conveying device 12 is extended and the ingot 50 is lowered to the vicinity of the work index mechanism 62, so that the ingot 50 is fixed to the work index mechanism 62 as shown in FIG. 1. In this method of fixing, bolts, not shown, are inserted to holes 46A, 46A formed on the respective corner portions of the work block 46 shown in FIG. 3, whereby the ingot 50 is fixed.

With this arrangement, in this embodiment, the ingot 50 is conveyed from the delivery position of the ingot 50 to the work index mechanism 62 of the slicing machine 14 by the loader part 36, and then fixed to the work index mechanism 62, therefore, the ingot 50 can be easily fixed to the slicing machine 14 compared with the conventional method of attaching the ingot wherein the ingot is lifted and fixed.

Next, the slicing machine 14 is driven, whereby the ingot 50 is indexed by the work index mechanism 62 and pressed against the inner peripheral edge with the work conveying mechanism 60 so as to be cut into the wafer 64. And, the wafer 64, which has been cut by the slicing machine 14, is adsorbed with the wafer adsorption-moving device 66 and conveyed to the conveying device 68, and then, is conveyed to the peel-off and wash-dry device 16 by the conveying device 68.

Figure 6:
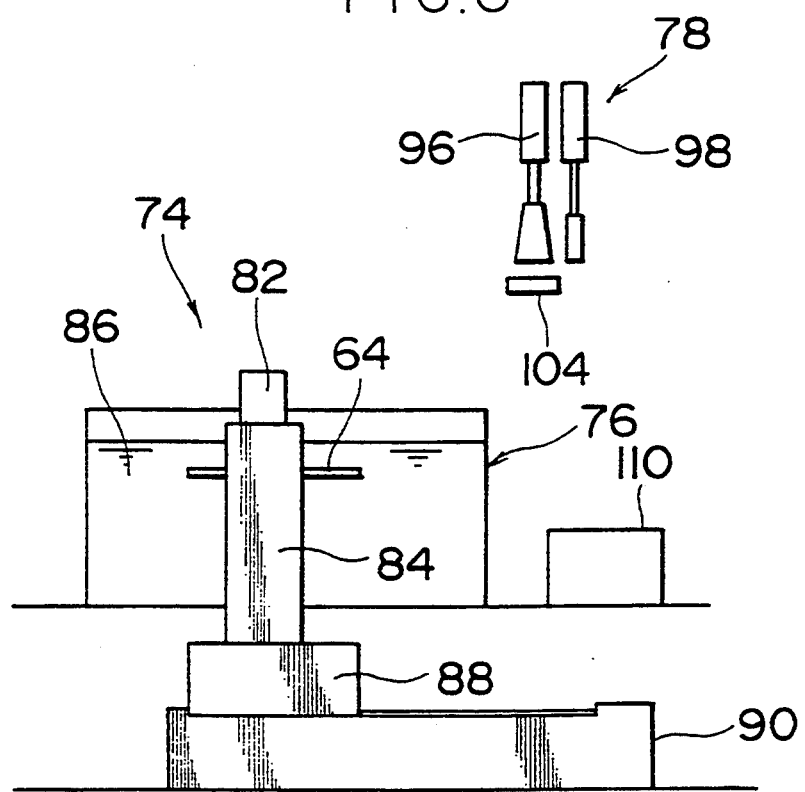
FIG. 6 is an explanatory view of the operation in the peel-off device of the slice base applied to the system for manufacturing the semiconductor wafer according to this invention.

Then, the wafer 64, which has been conveyed to the peel-off and wash-dry device 16 by the conveying device 68, is held between the holding plates 80 and 80 of the peel-off parts 70 shown in FIG. 4. After the wafer 64 is held, the arm 82 is contracted as shown in FIG. 6 and the wafer 64 is soaked in the warm water 86 of the warm water tank 76 for a predetermined time (30 seconds). As a result, the heat softening adhesive of the slice base 51 is heat softened.

Figure 7:
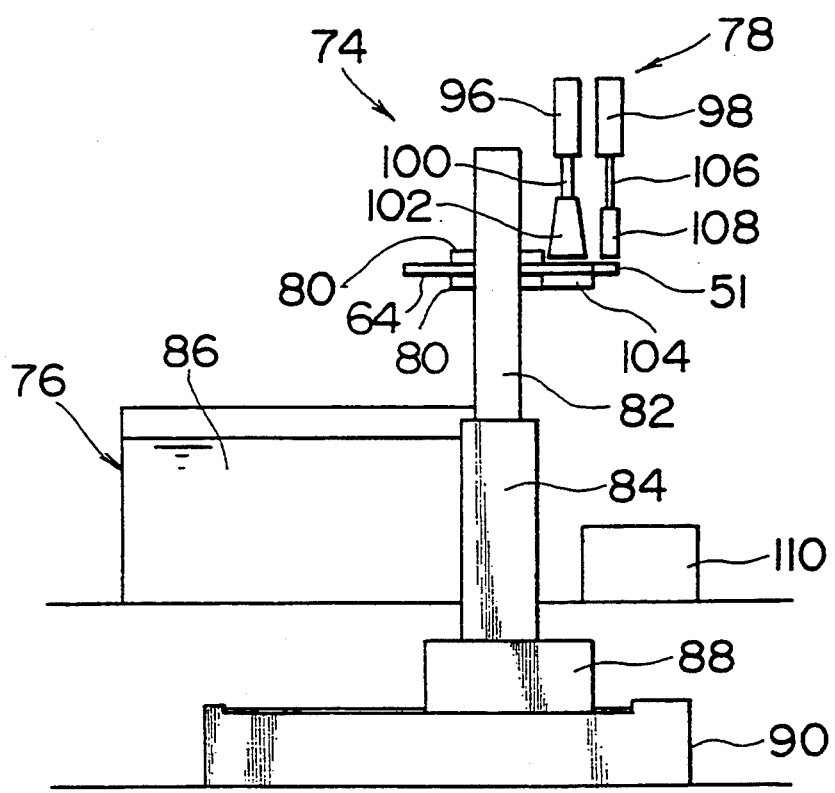
FIG. 7 is an explanatory view of the operation in the peel-off device of the slice base applied to the system for manufacturing the semiconductor wafer according to this invention.

And, the arm 82 is extended while sliding and moving the base 88 shown in FIG. 7 after the predetermined time, and then, the wafer 64 is conveyed to the hammer part 78. When the wafer 64 is conveyed to the hammer part 78, the wafer 64 is held by the holding rod 102 and the holding base 104 as shown in FIG. 8, and the cylinder rod 106 of the peel-off cylinder 98 is extended. Therefore, the slice base 51 of the wafer 64 is hammered by the hammer rod 108 and peeled off from the wafer 64. That is, since the adhesive of the slice base 51 is heat softened with the warm water 86, the slice base 51 can be easily peeled off from the wafer 64 only by hammering. The peeled-off slice base 51 is collected to the bucket 110.

According to this embodiment, the heat softening adhesive of the slice base 51 is heat softened, thereafter, the slice base 51 is peeled off from the wafer by hammering with the hammer rod 108, therefore, the slice base 51 can be peeled off in shorter time without using chemicals.

When the slice base 51 is peeled off, the base is sliced and moved from the position shown in FIG. 7 in a right direction and the wafer 64, which the slice base 51 is peeled off, is conveyed to the wash-dry part 72 shown in FIG. 4. When the wafer 64 is conveyed to the wash-dry part 72, the wafer 64 is fed toward the wash-brush roller 114 by the conveying roller 112, and chips and the like adhering to the wafer 64 are removed while passing through the wash-brush roller 114. Moreover, the chips and the like adhering the wafer and the brush are peeled off and removed with the washing water jetted from the nozzles 128 and 128 in the wash-water injection part 118.

And, the washed wafer 64 is sent off to the scraper 120 with the conveying roller 116 and the water drops on the surface of the wafer 64 are removed by the scraper 120. Then, the wafer 64, from which the water drops are removed, is dried by the air from the dry part 122, thereafter, conveyed to the surface inspecting shown in FIG. 9 with the conveying device 138.

Thus, according to the wash-dry device 72 in this embodiment, since the wafer, which the slice base 51 is peeled off, is washed and dried continuously one by one, the wafer 64, which has been just cut with the slicing machine 14, can be efficiently washed and dried in a shorter time compared with the conventional method of washing and drying.

Incidentally, the heat softening adhesive is heat softened with the warm water 86 in this embodiment, however, this invention is not limited to this, the heat softening adhesive is heated partially so as to be heat softened, and the semiconductor wafer wherein the heat softening adhesive has been heat softened is held by the wafer holding mechanism, thereafter, the slice base may be pulled and peeled off from the semiconductor wafer.

Next, when the wafer 64 is conveyed to the surface inspecting device 18, a pass or fall to the standard is judged with the surface inspecting device 18, and the wafer 64 which is judged to pass is conveyed to the chamfering device 20 by the conveying device 142, the direction conversion device 144, and the conveying devices 146 and 154 (refer to FIG. 10).

Then, the wafer 64 conveyed to the chamfering device 20 is clamped by the master 166 of the upper vertical axis 158 shown in FIG. 11. And, the wafer 64 is rotated by the motor 168 and the grindstone 178 is rotated by the motor 188, whereby the movable table 180 is moved in a left direction in FIG. 11 such that the grindstone 178 presses against the edge of the wafer 64. For example, when the edge of the upper side of the wafer 64 is chamfered first, the bearing box 162 is lowered for the predetermined value so as to chamfer the edge of the lower side of the wafer 64.

After chamfering, the moving table 180 is moved in the direction of separating from the wafer 64 and the wafer 64 which has been chamfered is sucked by the suction part 172 and conveyed to the wash-dry device 22 by the conveying devices 192 and 194 shown in FIG. 12.

And, the wafer 64 conveyed to the wash-dry device 22 is fed to the wash-brush roller 198 by the conveying roller 196 and the chips and the like adhering the wafer 64 are removed by the wash-brush roller 198. Moreover, the chips and the like adheres to the brush is peeled off and removed by the wash water jetted from the nozzles 212 and 212 in the washing water injection part 204.

Next, the wafer 64, which the chips and the like has been removed, is sent off to the scraper 200 by the conveying roller 202 and the water drops on the surface thereof are removed by the scraper 200, thereafter, is conveyed to the dry part 206 by the conveying roller 202 and dried by the air from the air blow-off holes 220, 220 of the dry part 206.

With this arrangement, according to the wash-dry device 72 in this embodiment, the chamfered wafer 64 is washed and dried continuously one by one, therefore, the wafer 64 can be washed and dried efficiently in a short time.

And, the dried wafer 64 is stored one by one by the conveying device 222 in the cassette 224 of the wafer storing part 24.

The wafer 64 stored in the cassette 224 is conveyed to the next process, that is, the wrapping process.

Therefore, according to the system for manufacturing the semiconductor wafer in this embodiment, the processes such as the cutting the ingot 50 into the wafer 64, the peeling-off and washing-drying the slice base, the inspecting the wafer 64 and the chamfering are made into an assembly line operation.

With this arrangement, the semiconductor wafer can be manufactured automatically and the manufacturing efficiency improves compared with the conventional system of manufacturing the semiconductor wafer.

As has been described before, in the method of manufacturing the semiconductor wafer and the system therefor according to this invention, the slicing machine means, the peel-off means, the first wash-dry means, the surface inspecting means, the second wash-dry means, the chamfering means and the storing part are connected by the plural wafer conveying means so as to make the manufacturing of a wafer an assembly line operation and the ingot is conveyed to the slicing machine by the ingot conveying means, therefore, the semiconductor wafer can be manufactured automatically.

As a result, the manufacturing efficiency of the semiconductor wafer can be improved.

Moreover, in the method of manufacturing the semiconductor wafer and the system therefor according to this invention, the ingot is moved to the vicinity of the post by the ingot supply device, the chuck member is moved to the vicinity of the ingot supply device and lowered, the upper engageable portion of the ingot on the ingot supply device is engaged with the engageable portion of the chuck member, and the ingot is raised by the chuck member and conveyed to the ingot support portion of the slicing machine suspending the ingot, thereafter, the chuck member is lowered and the ingot is delivered to the ingot support portion, therefore, the ingot can be easily fixed to the slicing machine compared with the conventional method of attaching the ingot wherein the ingot is raised to the ingot holding portion.

Further, in the method of manufacturing the semiconductor wafer and the system therefor according to this invention, the semiconductor wafer is soaked for a predetermined time in the warm water tank wherein warm water at the temperature that the heat softening adhesive of the slice base is heat softened is stored, then, the semiconductor wafer is picked out from the warm water and the slice base is hammered by the hammer means and peeled off from the semiconductor wafer, therefore, the slice base can be peeled of in a short time without chemicals.

Moreover, in the method of manufacturing the semiconductor wafer and the system therefor according to this invention, the slice base may be pulled and peeled off from the semiconductor wafer by the peel-off means after heating partially the heat softening adhesive by the heater.

Further, in the method of manufacturing the semiconductor wafer and the system therefor according to this invention, the semiconductor wafer is brush-washed with jetting water to the semiconductor wafer by the washing part, so that the chips and the like adhering the surface thereof are removed, then, the wafer passed through the wiper portion is dried by blowing the air in the dry portion, therefore, the semiconductor wafer which has just been cut can be washed and dried effectively in a short time.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a semiconductor wafer comprising the steps of:

conveying a columnar ingot by an ingot conveying means and mounting it on a slicing machine;

cutting said ingot mounted on said slicing machine into wafers by said slicing machine, each wafer including a slice base;

conveying one of said wafers cut by said slicing machine by a first wafer conveying means to a peel-off means where the slice base of said wafer is peeled off said wafer by said peel-off means to create a peeled wafer;

conveying the peeled wafer to a first wash-dry means by a second wafer conveying means where said peeled wafer is washed and dried by the first wash-dry means;

conveying said peeled wafer which has been washed and dried by the first wash-dry means to a chamfering means by a third wafer conveying means where edges of said wafer are chamfered by said chamfering means to create a chamfered wafer;

conveying said chamfered wafer to a second wash-dry means by a fourth wafer conveying means where said wafer is washed and dried by the second wash-dry means; and conveying said chamfered wafer which has been washed and dried by the second wash-dry means to a storing portion by a fifth wafer conveying means where the chamfered wafer is stored in the storing portion.

2. A method of manufacturing a semiconductor wafer as set forth in claim 1, wherein:

said peeled wafer which has been washed and dried by the first wash-dry means is conveyed to a surface inspecting means by a sixth wafer conveying means; the peeled wafer is inspected by the surface inspecting means to determine a pass or fail of a standard, the peeled wafer passing the standard being an acceptable wafer; and conveying the acceptable wafer to said chamfering means by a seventh wafer conveying means.

3. A method of manufacturing a semiconductor wafer as set forth in claim 1, wherein according to the method of conveying said ingot:

a plurality of ingots are supplied to a vicinity of a post disposed near said slicing machine by an ingot supplying device;

an engageable portion of a chuck member is engaged with an upper engageable portion of said ingot supplied to the vicinity of said post; and said ingot is lifted by said chuck member, and at the same time, said chuck member is moved along the post to an ingot support portion of said slicing machine, and said ingot is delivered to the ingot support portion.

4. A method of manufacturing a semiconductor wafer as set forth in claim 1, wherein the wafer is attached to the slice base by a heat softening adhesive, and according to the method of peeling off said slice base, the wafer, to which said slice base is attached, is immersed in warm water having such a temperature that said heat softening adhesive of said slice base is heat softened for a predetermined time, thereafter, said wafer is taken out of the warm water and said slice base is subjected to hammering so that said slice base is peeled off said wafer.

5. A method of manufacturing a semiconductor wafer as set forth in claim 1, wherein the wafer is attached to the slice base by a heat softening adhesive, and according to the method of peeling off said slice base, said heat softening adhesive of said slice base is heat softened by a heater, and thereafter, said slice base is peeled off the wafer.

6. A method of manufacturing a semiconductor wafer as set forth in claim 1, wherein according to the method of washing and drying said wafer:

said wafer is washed by a pair of rotary brushes while spraying water against said wafer;

said wafer washed by said rotary brushes is separated from water and water drips adhering to said wafer washed by said rotary brushes are removed by a wiper; and air is blown against said wafer, from which the water drips have been removed by the wiper, so that said wafer can be dried.

7. A system for manufacturing a semiconductor wafer, comprising:

an ingot conveying means for conveying a columnar ingot;

a slicing machine mounted thereon with said ingot conveyed by said ingot conveying means, for cutting said ingot into wafers, each wafer including a slice base;

a peel-off means connected to said slicing machine through a first conveying means, for peeling off the slice base of said wafer which has been cut by said slicing machine from said ingot;

a first wash-dry means connected to said peel-off means through a second wafer conveying means, for washing and drying said wafer, from which the slice base has been peeled off by said peel-off means;

a chamfering means connected to the first wash-dry means through a third wafer conveying means, for chamfering edges of said wafer which have been washed and dried by the first wash-dry means;

a second wash-dry means connected to the chamfering means through a fourth wafer conveying means, for washing and drying said wafer which has been chamfered by the chamfering means; and a storing portion connected to the second wash-dry means through a fifth wafer conveying means, for storing the wafers which have been washed and dried by the second wash-dry means.

8. A system for manufacturing a semiconductor wafer as set forth in claim 7, wherein a surface inspecting means for determining pass or fail in a standard for the wafer washed and dried by said first wash-dry means is connected to the first wash-dry means through a sixth wafer conveying means, and the wafer which has been determined to be accepted by the surface inspecting means is conveyed to the chamfering means through a seventh conveying means.

9. A system for manufacturing a semiconductor wafer as set forth in claim 7, wherein said ingot conveying means includes:

a post disposed near said slicing machine;

a chuck member provided vertically movably along said post and linearly movably to and from an ingot support portion of said slicing machine and having an engageable portion engageable with an upper engageable portion of the ingot; and an ingot supply device for supplying a plurality of ingots to the vicinity of said post: said engageable portion of the chuck member being engaged with said upper engageable portion of the ingot supplied by said ingot supply device to lift the ingot, moving the ingot in a suspended state to an ingot support portion of the slicing machine and delivering the ingot to the ingot support portion.

10. A system for manufacturing a semiconductor wafer as set forth in claim 7, wherein the wafer is attached to the slice base by a heat softening adhesive, and said peel-off means includes:

a warm water tank which stores warm water having such a temperature that said heat softening adhesive of the slice base attached to said wafer is heat softened;

a means for immersing said wafer into the warm water in the warm water tank;

a means for holding said wafer taken out of the warm water; and a hammering means for hammering the slice base of said wafer held by the wafer holding means to peel off the slice base from said wafer.

11. A system for manufacturing a semiconductor wafer as set forth in claim 7, wherein the wafer is attached to the slice base by a heat softening adhesive, and said peel-off means includes:

a heater for heat softening said heat softening adhesive of the slice base attached to said wafer;

a wafer holding means for holding said wafer in which said heat softening adhesive is heat softened; and a peel-off means for peeling the slice base off said wafer held by said wafer holding means.

12. A system for manufacturing a semiconductor wafer as set forth in claim 7, wherein said first wash-dry means includes:

a washing portion for washing said wafer by a pair of rotary brushes while spraying water to said wafer;

a wiper portion for removing water drips adhering to said water which has passed through said washing portion;

a drying portion for blowing air against said water which has passed through the wiper portion to dry said wafer; and a conveying portion for continuously conveying said wafer to the washing portion, the wiper portion and the drying portion.

13. A system for manufacturing a semiconductor wafer as set forth in claim 7, wherein said second wash-dry means includes:

a washing portion for washing said wafer by a pair of rotary brushes while spraying water to said wafer;

a wiper portion for removing water drips adhering said water which has passed through said washing portion;

a drying portion for blowing air against wafer which has passed through said wiper portion to dry said wafer; and a conveying portion for continuously conveying said wafer to the washing portion, the wiper portion and the drying portion.

* * * * *